United States Patent
Farnworth et al.

(10) Patent No.: US 6,437,451 B2
(45) Date of Patent: *Aug. 20, 2002

(54) TEST INTERCONNECT FOR SEMICONDUCTOR COMPONENTS HAVING BUMPED AND PLANAR CONTACTS

(75) Inventors: Warren M. Farnworth, Nampa; Salman Akram, Boise, both of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/738,915

(22) Filed: Dec. 14, 2000

Related U.S. Application Data

(63) Continuation of application No. 09/274,138, filed on Mar. 22, 1999, now Pat. No. 6,222,280.

(51) Int. Cl.[7] .................. H01L 23/48; H01L 23/52; H01L 29/40
(52) U.S. Cl. .................. 257/780; 257/739; 257/777; 257/773; 257/680; 257/686; 257/723
(58) Field of Search .................. 257/780, 739, 257/773, 689, 737, 738, 680, 686, 774, 777, 723, 706, 717; 438/119, 614

(56) References Cited

U.S. PATENT DOCUMENTS

| | | |
|---|---|---|
| 4,937,653 A | 6/1990 | Blonder et al. |
| 5,006,792 A | 4/1991 | Malhi et al. |
| 5,046,239 A | 9/1991 | Miller et al. |
| 5,073,117 A | 12/1991 | Malhi et al. |
| 5,137,461 A | 8/1992 | Bindra et al. |
| 5,172,050 A | 12/1992 | Swapp |
| 5,196,371 A * | 3/1993 | Kulesza et al. .......... 438/119 |
| 5,196,726 A | 3/1993 | Nishiguichi et al. |
| 5,329,423 A | 7/1994 | Scholz |

(List continued on next page.)

OTHER PUBLICATIONS

U.S. patent application Ser. No. 09/110,231, Farnworth et al., pending.

U.S. patent applicaton Ser. No. 09/234,725, Akram, pending.

*Primary Examiner*—Caridad Everhart
*Assistant Examiner*—Igwe U. Anya
(74) *Attorney, Agent, or Firm*—Stephen A. Gratton

(57) ABSTRACT

An interconnect for testing semiconductor components having both bumped contacts, and planar contacts, is provided. The interconnect includes: a substrate, first contacts on the substrate for electrically engaging the bumped contacts, and second contacts on the substrate for electrically engaging the planar contacts. In illustrative embodiments the first contacts include recesses in the substrate covered with a conductive layer, or recesses formed in a compliant layer on the substrate, or conductive polymer donuts sized and shaped to retain the bumped contacts. In illustrative embodiments the second contacts include etched pillars having penetrating projections, or conductive polymer bumps having penetrating particles, or flat topped projections having a compliant layer thereon. The interconnect can be used to construct a die level test carrier for testing components in singulated form, or to construct a wafer level test carrier for testing components in wafer or panel form.

22 Claims, 7 Drawing Sheets

U.S. PATENT DOCUMENTS

| | | |
|---|---|---|
| 5,341,564 A | 8/1994 | Akhavain et al. |
| 5,419,807 A | 5/1995 | Akram et al. |
| 5,420,520 A | 5/1995 | Anschel et al. |
| 5,478,779 A | 12/1995 | Akram |
| 5,481,205 A | 1/1996 | Frye et al. |
| 5,483,741 A | 1/1996 | Akram et al. |
| 5,500,605 A | 3/1996 | Chang |
| 5,519,332 A | 5/1996 | Wood et al. |
| 5,539,324 A | 7/1996 | Wood et al. |
| 5,541,525 A | 7/1996 | Wood et al. |
| 5,559,444 A | 9/1996 | Farnworth et al. |
| 5,578,526 A | 11/1996 | Akram et al. |
| 5,592,736 A | 1/1997 | Akram et al. |
| 5,625,298 A | 4/1997 | Hirano et al. |
| 5,629,837 A | 5/1997 | Barabi et al. |
| 5,663,654 A | 9/1997 | Wood et al. |
| 5,686,317 A | 11/1997 | Akram et al. |
| 5,691,041 A | 11/1997 | Frankeny et al. |
| 5,783,461 A | 7/1998 | Hembree |
| 5,796,264 A | 8/1998 | Farnworth et al. |
| 5,815,000 A | 9/1998 | Farnworth et al. |
| 5,834,945 A | 11/1998 | Akram et al. |
| 5,878,485 A | 3/1999 | Wood et al. |
| 5,896,036 A | 4/1999 | Wood et al. |
| 5,915,977 A | 6/1999 | Hembree et al. |
| 5,929,647 A | 7/1999 | Akram et al. |
| 5,931,685 A | 8/1999 | Hembree et al. |
| 5,962,921 A | 10/1999 | Farnworth et al. |
| 5,982,185 A | 11/1999 | Farnworth et al. |
| 6,005,288 A | 12/1999 | Farnworth et al. |
| 6,016,060 A | 1/2000 | Akram et al. |
| 6,018,249 A | 1/2000 | Akram et al. |
| 6,025,728 A | 2/2000 | Hembree et al. |
| 6,025,730 A | 2/2000 | Akram et al. |
| 6,025,731 A | 2/2000 | Hembree et al. |
| 6,040,239 A | 3/2000 | Akram et al. |
| 6,040,702 A | 3/2000 | Hembree et al. |
| 6,068,669 A | 5/2000 | Farnworth et al. |
| 6,072,326 A | 6/2000 | Akram et al. |
| 6,091,250 A | 7/2000 | Wood et al. |
| 6,091,251 A | 7/2000 | Wood et al. |
| 6,091,252 A | 7/2000 | Akram et al. |
| 6,094,058 A | 7/2000 | Hembree et al. |
| 6,107,109 A | 8/2000 | Akram et al. |
| 6,114,240 A | 9/2000 | Akram et al. |
| 6,127,736 A | 10/2000 | Akram |
| 6,130,148 A | 10/2000 | Farnworth et al. |
| 6,175,241 B1 | 1/2001 | Hembree et al. |
| 6,188,232 B1 | 2/2001 | Akram et al. |
| 6,204,678 B1 | 3/2001 | Akram et al. |
| 6,208,157 B1 | 3/2001 | Akram et al. |
| 6,222,280 B1 * | 4/2001 | Farnworth et al. .......... 257/780 |
| 6,229,324 B1 | 5/2001 | Akram et al. |
| 6,232,243 B1 | 5/2001 | Farnworth et al. |
| 6,242,932 B1 | 6/2001 | Hembree |
| 6,242,935 B1 | 6/2001 | Akram |
| 6,255,833 B1 | 7/2001 | Akram et al. |
| 6,294,837 B1 | 9/2001 | Akram et al. |
| 6,310,484 B1 | 10/2001 | Akram et al. |
| 6,313,651 B1 | 11/2001 | Hembree et al. |
| 6,329,829 B1 | 12/2001 | Farnworth et al. |
| 6,333,555 B1 | 12/2001 | Farnworth et al. |
| 6,340,894 B1 | 1/2002 | Farnworth et al. |
| 6,353,328 B2 | 3/2002 | Farnworth et al. |
| 6,362,637 B2 | 3/2002 | Farnworth et al. |
| 6,369,600 B2 | 4/2002 | Farnworth et al. |

* cited by examiner

TEST INTERCONNECT FOR SEMICONDUCTOR COMPONENTS HAVING BUMPED AND PLANAR CONTACTS

CROSS REFERENCE TO RELATED APPLICATIONS

This application is a continuation of application Ser. No. 09/274,138 filed on Mar. 22, 1999, U.S. Pat. No. 6,222,280.

FIELD OF THE INVENTION

This invention relates generally to the manufacture and testing of semiconductor components. More particularly, this invention relates to an interconnect for electrically engaging semiconductor components having both bumped, and planar, terminal contacts.

BACKGROUND OF THE INVENTION

Semiconductor components, such as bare dice, chip scale packages, BGA devices and wafers can include bumped contacts. For example, bumped contacts, such as solder balls, allow a component to be surface mounted to a mating substrate (e.g., PCB) using a solder reflow process. This type of component is sometimes referred to as a "bumped" component (e.g., bumped die, bumped wafer). Semiconductor components can also include planar contacts. For example, components can include planar land pads, or planar bond pads.

For testing the integrated circuits contained on semiconductor components it is necessary to make temporary electrical connections with the bumped contacts, or with the planar contacts. Different types of interconnects have been developed for making these temporary electrical connections. For example, a wafer probe card is one type of interconnect that is used to test semiconductor wafers. Another type of interconnect, is contained within a carrier for temporarily packaging singulated components, such as bare dice and chip scale packages, for test and burn-in. The interconnects include contacts that make the electrical connections with the terminal contacts on the components.

Sometimes a semiconductor component can include both bumped contacts, and planar contacts. For example, a chip scale package can include solder balls bonded to land pads. Some of the land pads may not include a solder ball. For testing this type of component a two step process must be utilized. In a first test step, electrical connections are made to the bumped contacts using a first interconnect constructed for bumped contacts. In a second test step, electrical connections are made to the planar contacts using a second interconnect constructed for planar contacts.

It would be desirable for a single interconnect to be able to accommodate both bumped contacts and planar contacts. This would simplify the test procedure, and the equipment associated with test processes. Such an interconnect must be able to compensate for the different surface topographies of the bumped contacts and the planar contacts. In particular, the bumped contacts are raised above the surface of the component, while the planar contacts are substantially planar to the surface of the component. In addition, the bumped contacts can have different sizes and heights, such that the bumped contacts are not all located along a common plane. Similarly planar contacts can vary in size, location and planarity on the component.

Another problem with making temporary electrical connections with a component occurs when the contacts are located along a center line of the component. In particular, the component can tilt if the contact pressure is not applied directly along the center line of the component to the component contacts. It would be desirable for an interconnect to be configured to prevent tilting of the component during electrical engagement of the contacts.

The present invention is directed to an interconnect for making temporary electrical connections with semiconductor components having both bumped contacts and planar contacts. The interconnect includes first contacts constructed to center and retain the bumped contacts, and to accommodate variations in the size and planarity of the bumped contacts. In addition, the interconnect includes second contacts constructed to electrically engage the planar contacts.

SUMMARY OF THE INVENTION

In accordance with the present invention, an improved interconnect for testing semiconductor components having both bumped contacts and planar contacts is provided. Also provided are a test carrier, and a test system incorporating the interconnect.

The interconnect, simply stated, comprises: a substrate, a plurality of first contacts on the substrate for electrically engaging the bumped contacts, and a plurality of second contacts on the substrate for electrically engaging the planar contacts. Different embodiments are provided for the interconnect contacts including compliant embodiments, able to cushion contact forces, and to compensate for variations in the size and planarity of the contacts on the components. Preferably, either the first contacts or the second contacts on the interconnect are provided in a compliant embodiment.

In an illustrative embodiment, the first contacts comprise recesses in the substrate at least partially covered with a conductive layer. The recesses are configured to retain and electrically engage the bumped contacts. In an alternate embodiment, the recesses are formed in a polymer layer deposited on the substrate, which allows flexure in a z-direction. In another alternate embodiment the first contacts comprise conductive polymer donuts formed on a surface of the substrate. The polymer donuts are sized and shaped to compliantly retain, and electrically engage the bumped contacts.

The second contacts comprise projections on the substrate configured to simultaneously engage the planar contacts during electrical engagement of the bumped contacts by the first contacts. In addition, the second contacts have a height selected to space the component from the interconnect such that the bumped contacts are not excessively deformed during electrical engagement by the first contacts.

In an illustrative embodiment, the second contacts include penetrating projections for penetrating the planar contacts to a limited penetration depth. In an alternate embodiment, the second contacts comprise conductive polymer bumps. In another alternate embodiment, the second contacts have a planar tip portion configured to support and prevent tilting of the component, during electrical engagement of the bumped contacts by the first contacts.

Suitable materials for forming the substrate include silicon, ceramic, and plastic. With the substrate comprising silicon both the first contacts and the second contacts can be formed integrally with the substrate using an etching process. In the compliant embodiments a conductive polymer material, such as a metal filled silicone, or an anisotropic adhesive can be used to form the interconnect contacts. Using conductive polymers, the interconnect contacts are naturally resilient to provide compliancy for cushioning contact forces, and for accommodating variations in the size and planarity of the component contacts. In addition, the resiliency of the conductive polymer allows the interconnect contacts to be compression loaded during test procedures, while conductive dendritic particles within the conductive polymer, penetrate oxide layers covering the component contacts. The compliant contacts can be formed by stenciling, screen printing, or otherwise depositing, a viscous conductive elastomeric material in a desired pattern, followed by partial curing, planarization and then total curing.

The die level carrier is configured to retain singulated semiconductor components, such as bare dice and packages, in electrical communication with test circuitry. The die level carrier includes: a base, the interconnect mounted to the base, and a force applying mechanism for biasing the component against the interconnect.

The wafer level carrier is configured to retain a wafer, or portion of a wafer, containing multiple semiconductor dice. Alternately the wafer level carrier can be configured to retain, a wafer, or a panel containing multiple semiconductor packages.

DETAILED DESCRIPTION OF THE PREFERRED EMBODIMENT

Figure 1A:
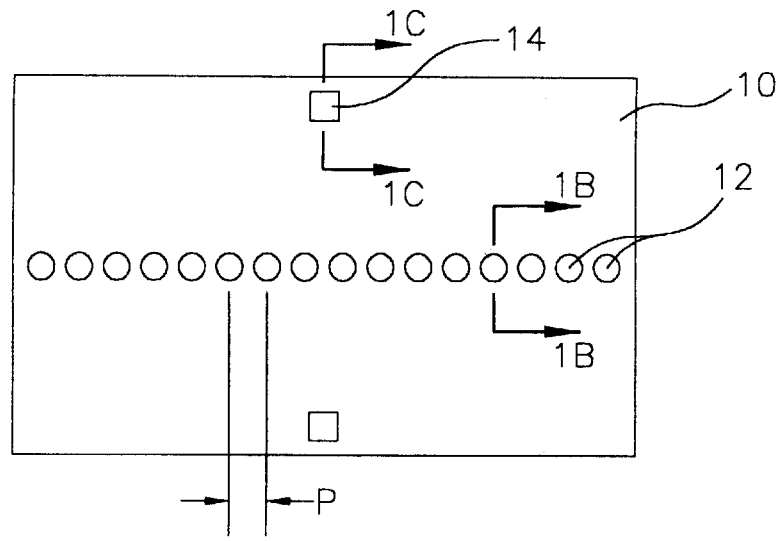
FIG. 1A is a bottom view of a semiconductor component having both bumped contacts and planar contacts.

Referring to FIG. 1, a semiconductor component 10 that includes both bumped contacts 12 and planar contacts 14 is illustrated. As used herein, the term "semiconductor component" refers to an electronic component that includes a semiconductor die. Exemplary semiconductor components include bare semiconductor dice, chip scale packages, ceramic or plastic semiconductor packages, semiconductor wafers, BGA devices, and multi chip modules.

Figure 1B:
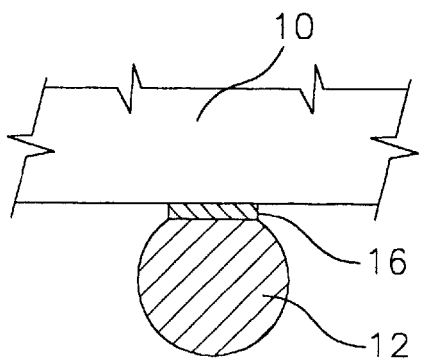
FIG. 1B is an enlarged cross sectional view taken along section line 1B—1B of FIG. 1A illustrating a bumped contact on the component.
Figure 1C:
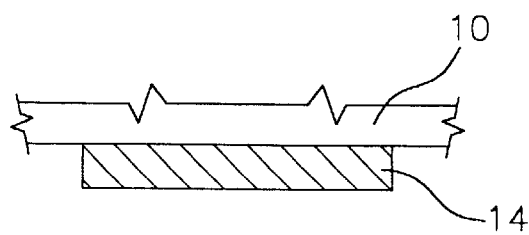
FIG. 1C is an enlarged cross sectional view taken along section line 1C—1C of FIG. 1A illustrating a planar contact on the component.

The bumped contacts 12 and the planar contacts 14 are in electrical communication with integrated circuits contained on the semiconductor component 10. The bumped contacts 12 and planar contacts 14 allow electrical access from the outside to the integrated circuits on the component 10. As shown in FIG. 1B, the bumped contacts 12 can comprise metal balls, such as solder balls, attached to pads 16 on the component 10. Alternately, rather than being balls, the bumped contacts 12 can have other shapes such as hemispheres, bumps, or cones. As shown in FIG. 1C, the planar contacts 14 comprise metal pads such as land pads, bond pads, or test pads formed on the component 10.

Figure 2:
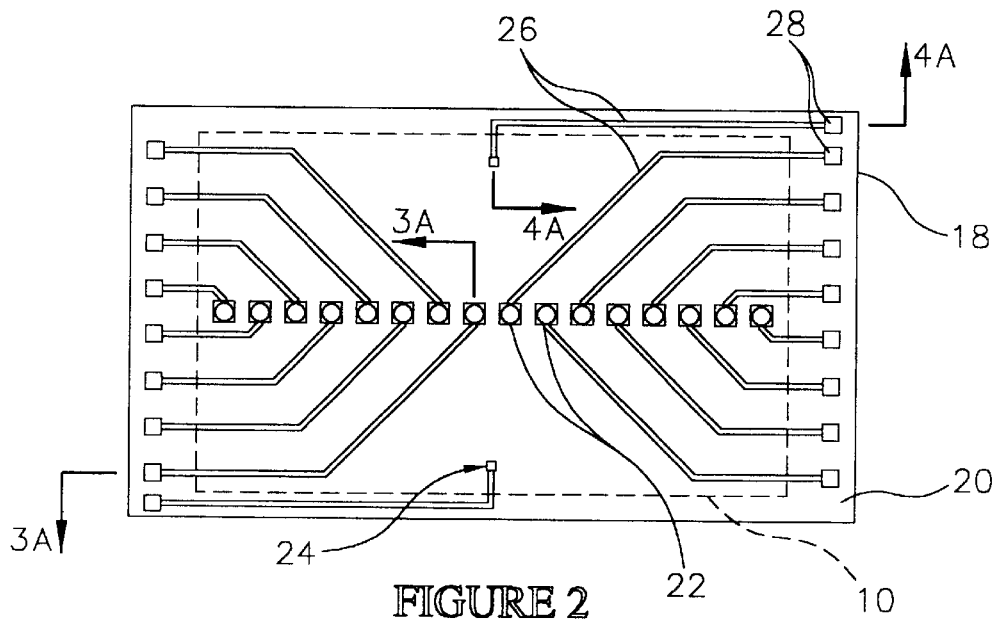
FIG. 2 is a schematic plan view of an interconnect constructed in accordance with the invention with the outline of the component superimposed thereon.

Referring to FIG. 2, an interconnect 18 constructed in accordance with the invention is illustrated. The interconnect 18 is adapted to establish temporary electrical connections with the component 10 for testing. The interconnect 18 includes a substrate 20; a plurality of first contacts 22 on the substrate 20 for electrically engaging the bumped contacts 12 on the component 10; and a plurality of second contacts 24 on the substrate for electrically engaging the planar contacts 14 on the component 10. The interconnect 18 also includes a plurality of conductors 26 on the substrate 20 in electrical communication with the first contacts 22 and the second contacts 24; and a plurality of input/output pads 28 on the substrate 20 in electrical communication with the conductors 26.

Figure 3A:
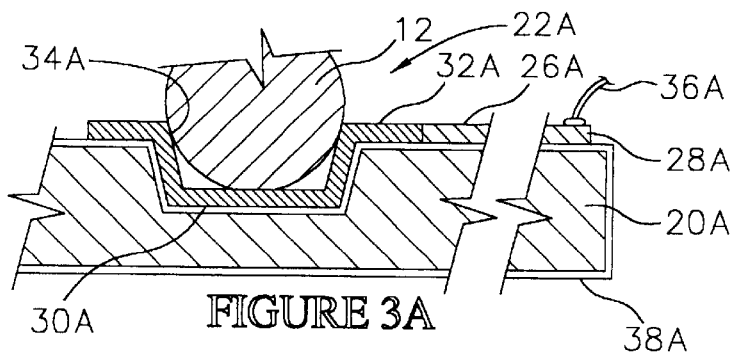
FIG. 3A is an enlarged cross sectional view taken along section line 3A—3A of FIG. 2 illustrating an interconnect contact configured to electrically engage a bumped contact on the component.

Referring to FIG. 3A, a first embodiment interconnect contact 22A is illustrated. The interconnect contact 22A comprises a recess 30 formed in the substrate 20A, that is sized and shaped to retain the bumped contact 12. The interconnect contact 22A also includes a conductive layer 32A at least partially covering the recess 30. The conductive layer 32A is in electrical communication with a conductor 26A, and with an input/output pad 28A on the substrate 20A. Peripheral edges 34A of the conductive layer 32A are adapted to penetrate the bumped contact 12 to pierce native oxide layers and contact the underlying metal.

In the first embodiment, the substrate 20A comprises silicon, which permits the interconnect contacts 22A, the conductive layers 32A, the conductors 26A and the input/output pads 28A to be made using semiconductor fabrication techniques (e.g., photolithography, etching, metallization). In addition, with silicon, a coefficient of thermal expansion (CTE) of the interconnect 18 substantially matches that of the component 10. However, the substrate 20A can also comprise ceramic, glass filled resin (e.g., FR-4), silicon-on-glass, or another semiconductor material such as gallium arsenide. with the substrate 20A comprising silicon, an electrically insulating layer 38A can be formed on exposed surfaces thereof for insulating the first contacts 22A, the conductors 26A, and the input/output pads 28A from a bulk of the substrate 20A. The electrically insulating layer 38A can comprise a grown or deposited oxide, such as $SiO_2$, or a deposited polymer, such as polyimide.

Preferably, the conductive layers 32A and conductors 26A comprise a highly conductive metal such as copper, aluminum, titanium, tantalum, tungsten, molybdenum or alloys of these metals. The conductive layers 32A and conductors 26A can be formed as a single layer of metal, or as a multi metal stack, using a thin film metallization process (e.g., CVD, patterning, etching or electroplating). Alternately, a thick film metallization process (e.g., screen printing, stenciling) can be used to form the conductive layers 32A and conductors 26A.

The conductors 26A also include the input/output pads 28A located along the peripheral edges of the interconnect 18. Wires 36A are wire bonded to the input/output pads 28A to provide separate electrical paths from test circuitry to the conductors 26. Preferably the input/output pads.. 28A are located on recessed surfaces along the edges of the substrate 20A to provide clearance for the wires 36A. Alternately, rather than wire bonding wires 36A, TAB tape can be used to electrically connect the input/output pads 28A to the test circuitry.

The recess 30A for the first contacts 22A can be etched by forming a mask (not shown) on the substrate 20A, such as a photopatterned resist mask, and then etching the substrate 20A through openings in the mask, using an etchant. With the substrate 20A comprising silicon, a suitable etchant for performing the etch process comprises a solution of KOH.

A size and shape of the recess 30A will be determined by the openings in the etch mask used to etch the substrate 20A. The recess 30A is sized and shaped to retain and electrically engage a single bumped contact 12. A representative diameter, or width, of the recess 30A can be from 2 mils to 50 mils or more. This diameter can be less than a diameter of the bumped contact 12 so that only portions thereof will be contacted. A depth of the recess 30A can be equal to or less than the diameter thereof. A pitch or spacing of the recess 30A relative to adjacent recesses 30A will exactly match a pitch P (FIG. 1A) of the bumped contacts 12.

Figure 3B:
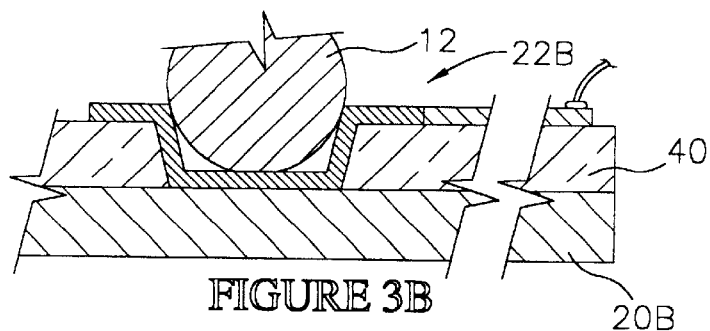
FIG. 3B is an enlarged cross sectional view equivalent to FIG. 3A illustrating an alternate embodiment interconnect contact formed on a compliant layer.

Referring to FIG. 3B, an alternate embodiment first contact 22B is illustrated. The alternate embodiment first contact 22B is substantially identical in construction to the previously described first contact 22A. However, rather than being formed in a substrate 20B, the first contact 22B is formed in a compliant layer 40 formed on the substrate 20B. The compliant layer 40 can comprise a polymer such as polyimide, photoimageable polyimide, polyester, epoxy, urethane, polystyrene, silicone or polycarbonate deposited to a desired thickness.

Recesses for the first contact 22B can be etched by forming a mask (not shown) on the compliant layer 40, such as a photopatterned resist mask, and then etching the compliant layer 40 through openings in the mask, using an etchant. With the compliant layer 40 comprising polyimide, a suitable etchant for performing the etch process comprises a solution of TMAH (tetramethylammonium hydroxide). If the compliant layer 40 comprises a photoimageable polyimide, an etch mask is not required, as the photoimageable material can be patterned by exposure to UV and then developed using a suitable developing solution.

Figure 3C:
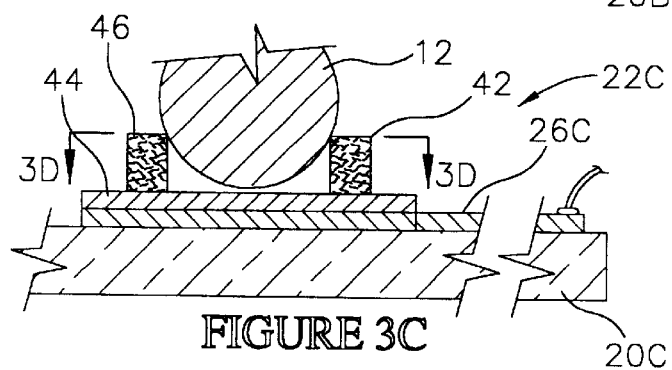
FIG. 3C is an enlarged cross sectional view equivalent to FIG. 3A illustrating an alternate embodiment interconnect contact in the form of a conductive polymer donut.

Referring to FIG. 3C, another alternate embodiment first contact 22C is illustrated. The first contact 22C comprises a conductive polymer donut 42, and a contact pad 44 which provides a bonding surface for the polymer donut 42. The contact pad 44 is in electrical communication with a conductor 26C on a substrate 20C. Preferably the contact pad 44 comprises a non-oxidizing metal, such as gold or palladium. The non-oxidizing contact pad 44 forms a "touch contact" surface, and provides a low resistance electrical path between the conductor 26C and the conductive polymer donut 42.

The conductive polymer donut 42 comprises a conductive elastomeric material deposited on the contact pad 44 in a desired size and shape. Suitable materials the conductive polymer donut 42 include metal filled adhesives (e.g., silver filled silicone) that are conductive in any direction. Alternately, the conductive polymer donut 42 can comprise an anisotropic adhesive that are conductive in only one direction. For example, Z-axis anisotropic adhesives are filled with conductive dendritic particles to a low level such that the particles do not contact each other in the X and Y planes. However, compression of the anisotropic adhesive provides an electrical path in the Z-direction. Curing is typically accomplished by compression of the conductive adhesive along the direction of conduction.

The conductive polymer donut 42 can be formed by screen printing, stenciling, or otherwise dispensing, a viscous conductive elastomeric material in a required size and shape. In the illustrative embodiment the conductive polymer donut 42 has an inside diameter sized and shaped to retain the bumped contact 12. The conductive elastomeric material can be provided in either a thermal plastic configuration or a thermal setting configuration. Thermal plastic conductive elastomers are heated to soften for use and then cooled for curing. Thermal setting conductive elastomers are viscous at room temperature but require heat curing at temperatures from 100–300° C. for from several minutes to an hour or more. Suitable conductive elastomers for forming the conductive polymer donut 42 include: materials containing dendritic silver flakes; "X-POLY" and "Z-POXY", by A. I. Technology, Trenton, N.J.; and "SHELL-ZAC", by Sheldahl, Northfield, Minn. Other suitable conductive elastomers are also sold by 3M, St. Paul, Minn.

During a test procedure, the conductive polymer donut 42 can be placed in compression during contact with the bumped contact 12, such that metal particles 46 within the conductive elastomeric material penetrate oxide layers covering the bumped contacts 12. In addition, the conductive materials used to form the conductive polymer donut 42 are naturally resilient and possess compliant characteristics. This compliancy can also provide force for pressing the metal particles 46 into the bumped contacts 12, and for accommodating variations in the z-direction locations of the bumped contacts 12.

Figure 3D:
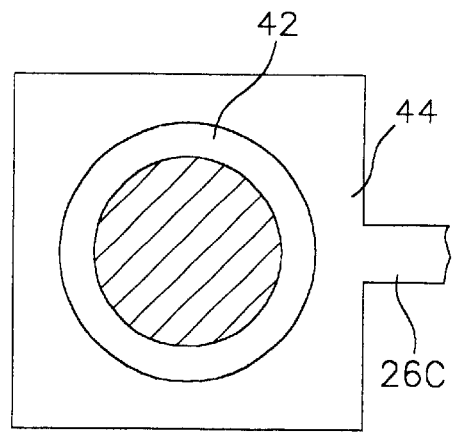
FIG. 3D is a cross sectional view taken along section line 3D—3D of FIG. 3C.
Figure 3E:
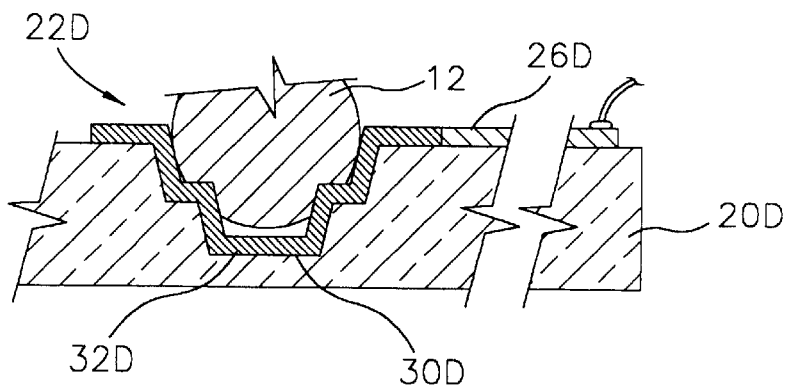
FIG. 3E is an enlarged cross sectional view equivalent to FIG. 3A illustrating an alternate embodiment interconnect contact in the form of a stepped recess.

Referring to FIG. 3E, another alternate embodiment first contact 22D is illustrated. The first contact 22D comprises a stepped recess 30D formed in a substrate 20D and at least partially covered with a conductive layer 32D. The conductive layer 32D is in electrical communication with a conductor 26D as previously described. In addition,, in this embodiment the substrate 20D comprises an electrically insulating material, such as ceramic or plastic, such that insulating layers are not required. During a test procedure the bumped contact 12 can be pressed into the stepped recess 30D. Deformation of the bumped contact 12 into the stepped recess 30D helps to compensate for variations in the size and planarity of the bumped contact 12.

Figure 3F:
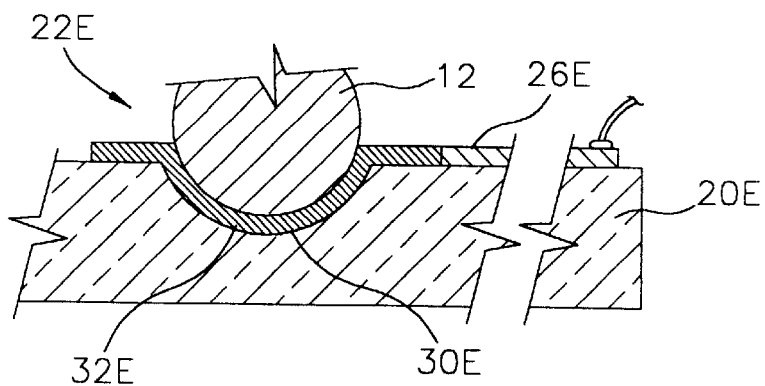
FIG. 3F is an enlarged cross sectional view equivalent to FIG. 3A illustrating an alternate embodiment interconnect contact in the form of a concave recess.

Referring to FIG. 3F, another alternate embodiment first contact 22E is illustrated. The first contact 22E comprise a concave recess 30E formed in an electrically insulating substrate 20E. The recess 30E has a size and shape that substantially matches a size and shape of the bumped contact 12. In addition, the recess 30E is at least partially covered with a conductive layer 32E in electrical communication with a conductor 26E.

Other types of contacts configured to make non-bonded, temporary electrical connections with bumped contacts 12 are described in the following U.S. Patent Applications, which are incorporated herein by reference:

U.S. patent application Ser. No. 08/829,193 entitled "Interconnect Having Recessed Contact Members With Penetrating Blades For Testing Semiconductor Dice And Packages With Contact Bumps";

U.S. patent application Ser. No. 08/823,490 entitled "Method, Apparatus And System For Testing Bumped Semiconductor Components"; and U.S. patent application Ser. No. 08/867,551, entitled "Interconnect For Making Temporary Electrical Connections With Bumped Semiconductor Components".

Figure 4A:
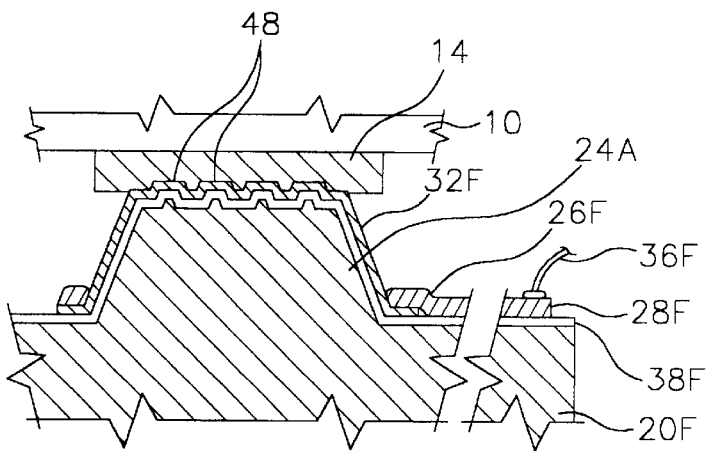
FIG. 4A is an enlarged cross sectional view taken along section line 4A—4A of FIG. 2 illustrating an interconnect contact configured to electrically engage a planar contact on the component.

Referring to FIG. 4A, a second contact 24A is illustrated. The second contact 24A comprises a projection formed on a substrate 20F. In this embodiment the substrate 20F comprises an etchable material such as silicon, and the second contact 24A can be formed using an etching process.

The second contact 24A is sized and shaped to electrically engage the planar contacts 14 on the component 10, as the first contacts 22 electrically engage the bumped contacts 12 on the component 10. In addition, the second contact 24A has a height selected to space the component 10 from the interconnect 18 such that the bumped contacts 12 do not deform excessively during engagement by the first contacts 22. Accordingly, the height of the second contact 24A is approximately equal, to but less than, the height of the bumped contacts 12. A representative height for the second contact 24A can be from 2 mils to 50 mils or more.

The second contact 24A includes penetrating projections 48 for penetrating the planar contacts 14 on the component 10 to a self limiting penetration depth. The penetrating projections 48 are at least partially covered with a conductive layer 32F in electrical communication with a conductor 26F and with an input/output pad 28F. In addition, a wire 36F is bonded to the input/output pad 28F, and an electrically insulating layer 38F electrically insulates the substrate 20F. The second contact 24A can be formed as described in U.S. Pat. No. 5,686,317, entitled "Method For Forming An Interconnect Having A Penetration Limited Contact Structure For Establishing A Temporary Electrical Connection With A Semiconductor Die", which is incorporated herein by reference.

Figure 4B:
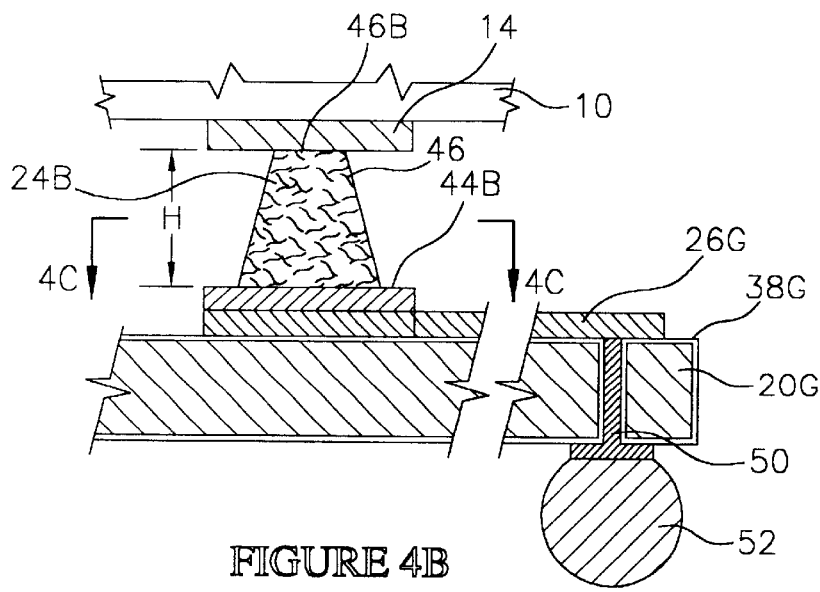
FIG. 4B is an enlarged cross sectional view equivalent to FIG. 4A illustrating an interconnect contact in the form of a conductive polymer bump.
Figure 4C:
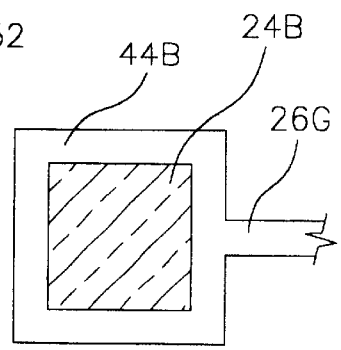
FIG. 4C is a cross sectional view taken along section line 4C—4C of FIG. 4B.

Referring to FIG. 4B, an alternate embodiment second contact 24B is illustrated. The second contact 24B comprises a conductive polymer projection formed on a contact pad 44B. The conductive polymer projection can comprise an isotropic or anisotropic elastomer as previously described for conductive polymer donut 42 (FIG. 3C). The contact pad 44B can comprise a non-oxidizing metal such as gold or palladium as previously described for contact pad 44 (FIG. 3D).

In the illustrative embodiment, the second contact 24B is generally conically shaped and has a planar tip portion. As will be further described, this shape can be achieved using a screen printing process. If required, the tip portion of the second contact 24B can be planarized such that a height "H" of the second contacts 24B on the interconnect 18 is uniform. Planarization can be accomplished by contact with a planar surface during the curing process. Additionally, the second contacts 24B can be placed in compression during the curing process by contact with a planar surface. A representative height "H" for the second contact 24B can be from 1–20 mils. A representative diameter at the base of the second contact 24B can be from 1–40 mils.

As shown in FIG. 4B, the second contact 24B can be used to establish a temporary electrical connection with the planar contact 14 of the component 10. In addition, the second contact 24B can be placed in compression during contact with the planar contact 14, such that metal particles 46B within the second contact 24B penetrate oxide layers covering the planar contact 14. In addition, the conductive material used to form the second contact 24B is naturally resilient such that the contact 24B will possess compliant characteristics. This compliancy can also provide force for pressing the metal particles 46B into the planar contact 14, and for accommodating variations in the z-direction locations of the planar contact 14.

The contact pad 44B for the second contact 24B is in electrical communication with a conductor 26G substantially as previously described. In addition, an insulating layer 38G electrically insulates the contact pad 44B and conductor 26G from a bulk of the substrate 20G. However, in this embodiment a conductive via 50 is formed in the substrate 20G and electrically connects the conductor 26G to a terminal contact 52 formed on a backside of the substrate 20G. The conductive via 50 can be formed using a laser machining process as described in U.S. patent application Ser. No. 08/993,965 now U.S. Pat. Ser. No. 5,962,921 entitled "Semiconductor Interconnect Having Laser Machined Contacts", which is incorporated herein by reference. This type of conductive via can also be used to electrically connect the first contacts 22 (FIG. 2) to terminal contacts on the interconnect 18. For example, in the first contact 22A of FIG. 3A, a conductive via can be located along a center line of the recess 30A substantially as shown in FIG. 7B.

Figure 4D:
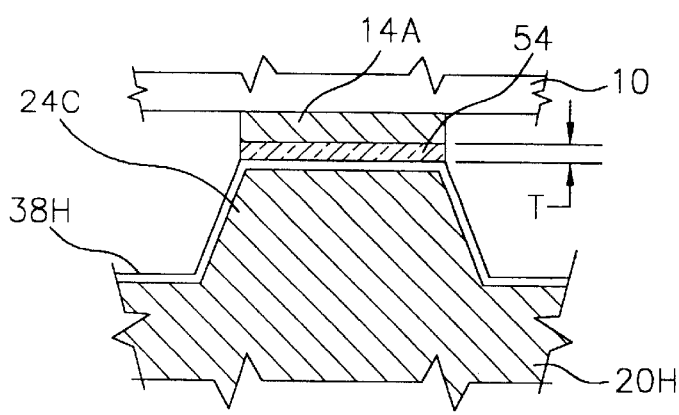
FIG. 4D is an enlarged cross sectional view equivalent to FIG. 4A illustrating an interconnect contact engaging a dummy planar contact on the component.

Referring to FIG. 4D, an alternate embodiment second contact 24C is illustrated. In this embodiment a planar contact 14A on the component 10 comprises a "dummy contact" that has no electrical function. The second contact 24C mechanically engages the planar contact 14A to provide support, such that the component 10 does not tilt during electrical engagement of the bumped contacts 12 (FIG. 1A) by the first contacts 22 (FIG. 2). In addition, the second contact 24C maintains a "stand off" spacing between the interconnect 18 and the component 10 such that the bumped contacts 12 (FIG. 1A) on the component 10 are not excessively deformed by the first contacts 22 (FIG. 2). In the illustrative embodiment, two second contacts 24C are provided on either side of the first contacts 22. However, a greater number of second contacts 24C can be provided, and located on different portions of the interconnect 10 to perform a required support function.

In this embodiment, the second contact 24C comprises a generally pyramidally shaped projection formed on a substrate 20H. In addition, the second contact 24C includes a planar tip portion which supports and prevents tilting. of the component 10. A representative value for the width, and the height of the second contact 24C can be from 1–50 mils or greater.

Also in this embodiment the substrate 20H can comprise silicon and the second contact 24C can be formed by anisotropically etching the substrate 20H using an etchant such as KOH as previously described. The substrate 20H can also includes an insulating layer 38H as previously described. In addition, the second contact 24C includes a cushioning layer 54 having a thickness of "T". The cushioning layer 54 can comprise a polymer material, such as polyimide or silicone, deposited on a tip portion of the second contact 24C to the thickness T. A representative value for the thickness T can be from 1–5 mils. Alternately the cushioning layer 54 can comprise a separate member such as a gasket, or a piece of tape, attached to the tip portion of the second contact 24C. As another alternative, the second contact 24C can comprise a polymer material having compliant characteristics. Suitable polymers include polyimide, silicone and butyl rubber. In this case the cushioning layer 54 can be eliminated.

Figure 5A:
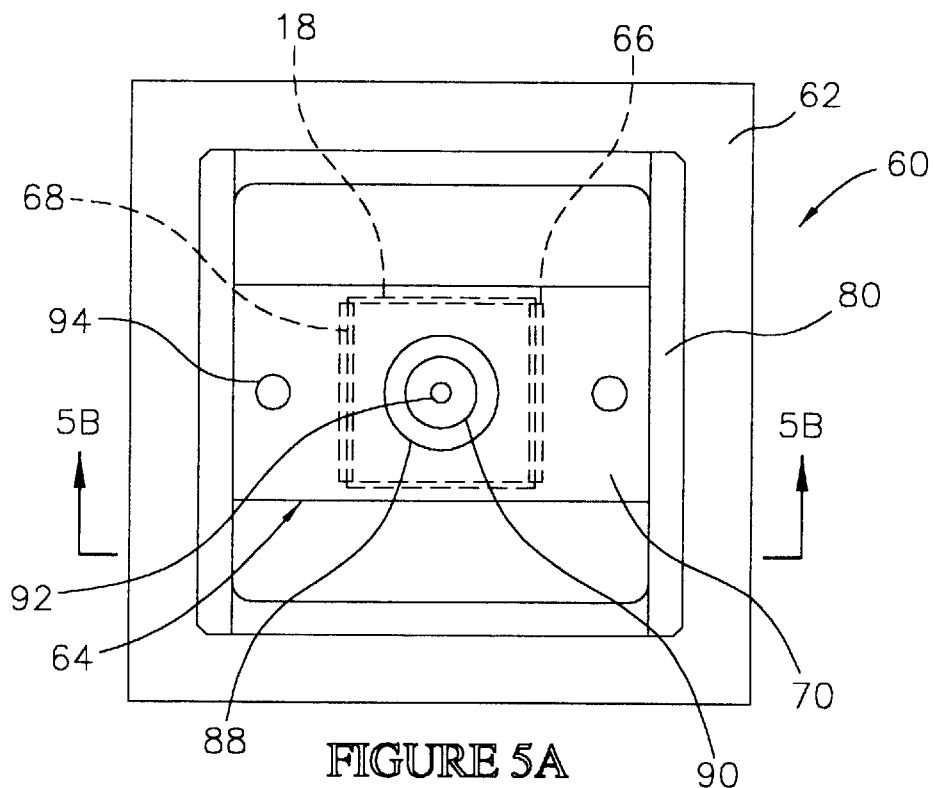
FIG. 5A is a plan view of a test carrier incorporating an interconnect constructed in accordance with the invention.
Figure 5B:
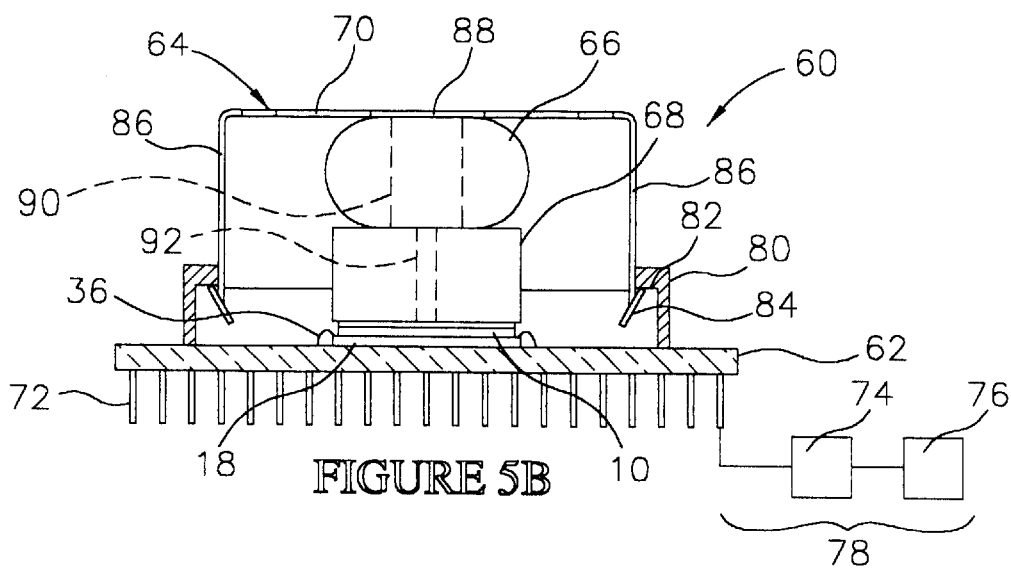
FIG. 5B is a cross sectional view taken along section line 5B—5B of FIG. 5A.

Referring to FIGS. 5A and 5B, a test carrier 60 constructed with the interconnect 18 is illustrated. The carrier 60 is adapted to temporarily package the semiconductor component 10 for testing and burn-in. In addition, the test carrier 60 is adapted to bias the component 10 against the interconnect 18.

The carrier 60 includes a base 62, and the interconnect 18 mounted to the base 62. The carrier 60 also includes a force applying mechanism 64 comprising a biasing member 66, a pressure plate 68, and a clamp 70. In addition, the carrier 60 includes a plurality of terminal leads 72 in electrical communication with the interconnect 18.

The terminal leads 72 are adapted for electrical communication with a test apparatus 74 (FIG. 5B), such as a burn-in board, and test circuitry 76 (FIG. 5B). The test circuitry 76 generates test signals, and transmits the test signals to the terminal leads 72, and through the interconnect 18 to the component 10. The test circuitry 76 also analyzes the resultant test signals transmitted from the component 10. The carrier 60, test apparatus 74, and test circuitry 76 form a test system 78 which permits. various electrical characteristics of the component 10 to be evaluated.

In the illustrative embodiment, the terminal leads 72 comprise pins formed in a pin grid array (PGA) on a backside of the base 62. Alternately, other configurations for the terminal leads 72 can be provided. For example, the carrier base 62 can include ball contacts in a ball grid array (BGA) or fine ball grid array (FBGA).

Also in the illustrative embodiment, the base 62 comprises a laminated ceramic material. A ceramic lamination process can be used to fabricate the base 62 with a desired geometry, and with metal features such as internal conductors and external pads. U.S. Pat. No. 5,519,332, entitled "Carrier For Testing An Unpackaged Semiconductor Die", which is incorporated herein by reference, describes a ceramic lamination process for fabricating the base 62.

Alternately, rather than ceramic, the base, 62 can comprise plastic and the metal features formed using a 3-D molding process. Previously cited U.S. Pat. No. 5,519,332 describes a 3-D molding process for fabricating the base 62.

Rather than ceramic or plastic, the base can also comprise a glass reinforced plastic (e.g., FR-4) similar to materials used for circuit boards. In this case, conventional plastic substrate fabrication processes, as described in *Ball Grid Array Technology*, by John H. Lau, McGraw-Hill Inc. (1995), can be used for fabricating the base 62.

The base 62 includes internal conductors (not shown) in electrical communication with the terminal leads 72. As will be further explained, bond wires 36 (FIG. 5B) are wire bonded to bond pads on the base 62 in electrical communication with the internal conductors in the base 62. The bond wires 36 (FIG. 5B) are also wire bonded to the input/output pads 28 (FIG. 2) on the interconnect 18, and establish electrical communication between the terminal leads 72 on the base 62, and the first contacts 22 (FIG. 2) and the second contacts 24 (FIG. 2) on the interconnect 18.

The base 62 also includes a clamp ring 80 for attaching the clamp 70 of the force applying mechanism 64 to the base 62 during assembly of the carrier 60. The clamp ring 80 is attached to the base 62, and as shown in FIG. 5B, has a frame-like configuration. As also shown in FIG. 5B, the clamp ring 80 includes grooves 82 wherein the clamp 70 is attached. In the illustrative embodiment, the clamp ring 80 comprises metal, and is attached to the base 62 using a brazing process. One suitable metal for the clamp ring 80 comprises "KOVAR" coated with gold. The base 62 can include bonding features, such as metal pads, for attaching the clamp ring 80.

The clamp 70 comprises a flexible bridge-like structure formed of a resilient material such as steel. The clamp 70 includes tabs 84 that physically engage the grooves 82 on the clamp ring 80. In addition, the clamp 70 includes opposed sides 86 movable towards one another to permit engagement of the tabs 84 on the clamp 70, with the grooves 82 on the clamp ring 80. The clamp 70 also includes an opening 88 which provides access to the component 10 for a vacuum assembly tool during assembly of the carrier 60. The biasing member 66 also includes an opening 90, and the pressure plate 68 includes an opening 92 for the vacuum assembly tool. A pair of openings 94 (FIG. 5A) can also be provided on the clamp 70 for manipulation of the clamp 70 by the vacuum assembly tool during assembly of the carrier 60.

The pressure plate 68 can comprise a metal, a plastic, or a ceramic material. A peripheral shape and thickness of the pressure plate 68 can be selected as required.

Assembly of the carrier can be accomplished manually, or using an automated assembly apparatus. U.S. Pat. No. 5,796,264, entitled "Apparatus For Manufacturing Known Good Semiconductor Dice", which is incorporated herein by reference, describes a method and apparatus for assembling the carrier. In the illustrative embodiment, alignment of the component 10 with the interconnect 18 can be performed using an optical alignment technique. Such an optical alignment technique is described in the above cited U.S. Pat. No. 5,796,264. Alignment of the component 10 with the interconnect 18 can also be performed using a mechanical alignment fence on the base 62, or on the interconnect 18. as will be hereinafter described.

Using the carrier 60 the component 10 can be tested as required. In the assembled carrier, the first contacts 22 (FIG. 2) on the interconnect 18 electrically engage the bumped contacts 12 on the component 10. In addition, the second contacts 24 (FIG. 2) on the interconnect 18 electrically engage the planar contacts 24 on the component 10. Also the component 10 can be provided with dummy contacts 14A (FIG. 4D) and the interconnect 18 can be provided with contacts 24C (FIG. 4D) to prevent tilting and flexure of the component 10 during electrical engagement thereof. Further, the contacts 24C provide a stand off support such that the contact bumps 12 are not excessively deformed by contact with the first contacts 22 on the interconnect 18.

Figure 6A:
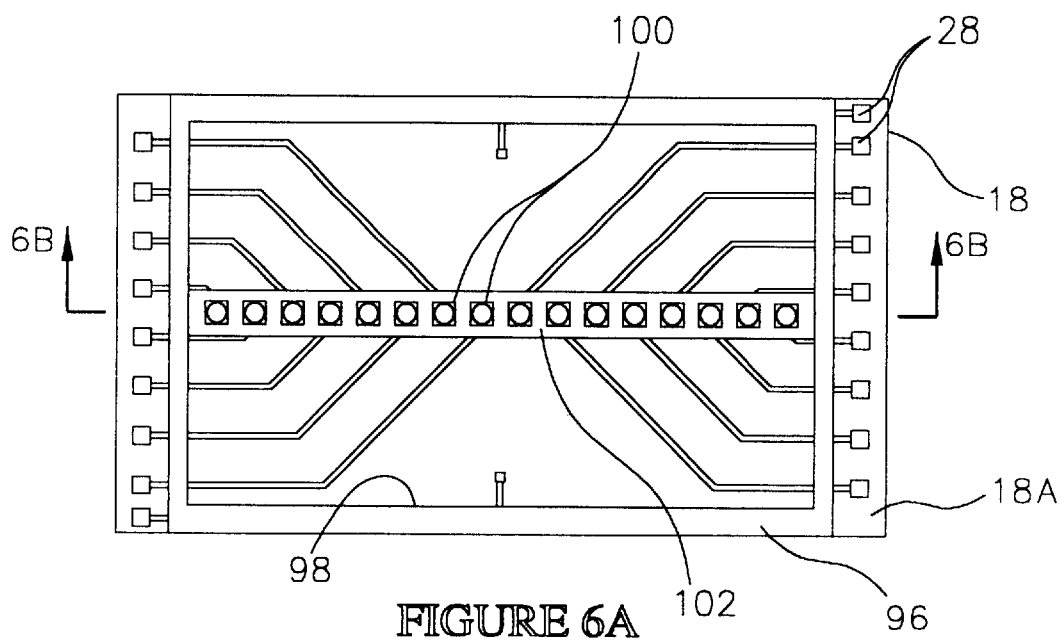
FIG. 6A is a plan view of an alternate embodiment interconnect having a polymer alignment member.
Figure 6B:
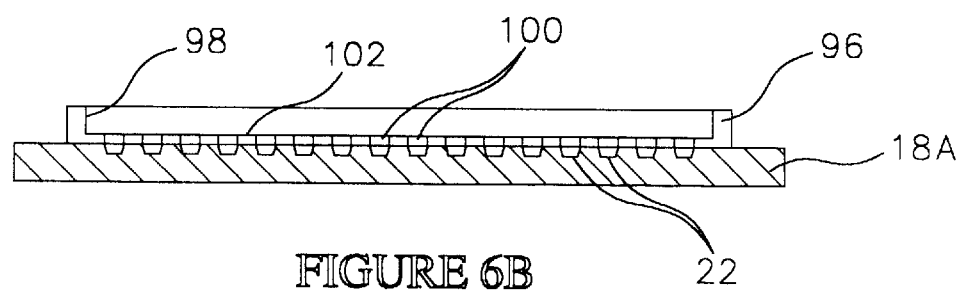
FIG. 6B is a cross sectional view of the polymer alignment member taken along section line 6B—6B of FIG. 6A.
Figure 6C:
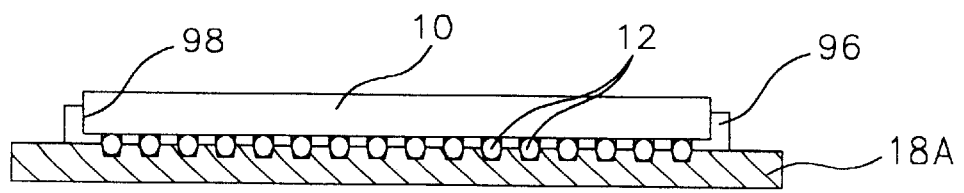
FIG. 6C is a cross sectional view of the polymer alignment member shown aligning the component.

Referring to FIGS. 6A–6C an alternate embodiment interconnect 18A is illustrated. The interconnect 18A is substantially similar in construction to interconnect 18 (FIG. 2) but also includes a polymer alignment member 96. The polymer alignment member 96 is adapted to align the bumped contacts 12 on the component 10 to the first contacts 22 on the interconnect 18A.

Preferably the alignment member 96 is formed of a photoimageable material such that patterning can be accomplished using a photolithographic process. One suitable polymer for forming the alignment member 96 comprises a negative tone resist, which is blanket deposited to a desired thickness, exposed, developed and then cured. A suitable resist formulation is sold by Shell Chemical under the trademark "EPON RESIN SU-8". Such a resist can be deposited to a thickness of from about 5–50 mils. A conventional resist coating apparatus, such as a spin coater, can be used to deposit the resist onto the surface of the interconnect 18A. The deposited resist can then be "prebaked" at about 95° C. for about 15 minutes and exposed in a desired pattern using a conventional UV aligner with a dose of about 165mJ/cm$^2$. Developing can be accomplished with a solution of PGMEA (propyleneglycol-monomethyletheracetate). This can be followed by a hard bake at about 200° C. for about 30 minutes. Another suitable material for forming the alignment member 96 is a photoimageable polyimide.

The alignment member 96 includes a peripheral alignment opening 98 sized and shaped to contact the peripheral edges of the semiconductor component 10. This provides coarse alignment of the bumped contacts 12 on the component 10 to the first contacts 22. As used herein, the term "coarse alignment" refers to a first alignment stage in which a registration between the bumped contacts 12 and the first contacts 22 is from about 1 mil to 6 mils.

In addition to the alignment opening 98, the alignment member 96 includes a connecting segment 102 having alignment openings 100 configured to provide fine alignment of individual bumped contacts 12 on the component 10 to individual first contacts 22 on the interconnect 18A. As used herein, the term "fine alignment" refers to a second alignment stage in which a registration between the bumped contacts 12 and the first contacts 22 is from about 1 mil to 3 mils. A representative diameter for the alignment openings 100 for 12 mil diameter bumped contacts 12 can be from 13 mils to 15 mils. Preferably connecting segment 102 has a thickness that is less than an average height of the bumped contacts 12. This thickness is preferably from about 3 mils to 7 mils. A remainder of the alignment member 96 has a thickness approximately equal to a thickness of the component.

Alternately rather than a deposited polymer the alignment member can comprise a separate plate attached to the interconnect 18 or to the carrier base 62 (FIG. 5B). Suitable materials for forming a separate alignment member include silicon, ceramic, plastic, glass filled resin and photosensitive glass. In addition, U.S. Pat. No. 5,559,444 entitled "Method And Apparatus For Testing Unpackaged Semiconductor Dice", which is incorporated herein by reference, describes a method for fabricating an alignment member.

Figure 7A:
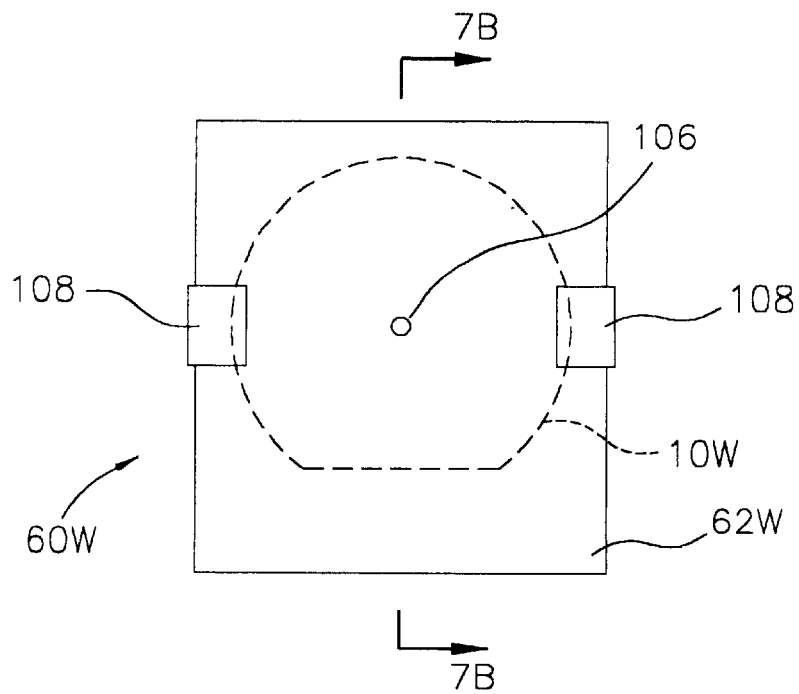
FIG. 7A is a plan view of a wafer test carrier incorporating an interconnect constructed in accordance with the invention.
Figure 7B:
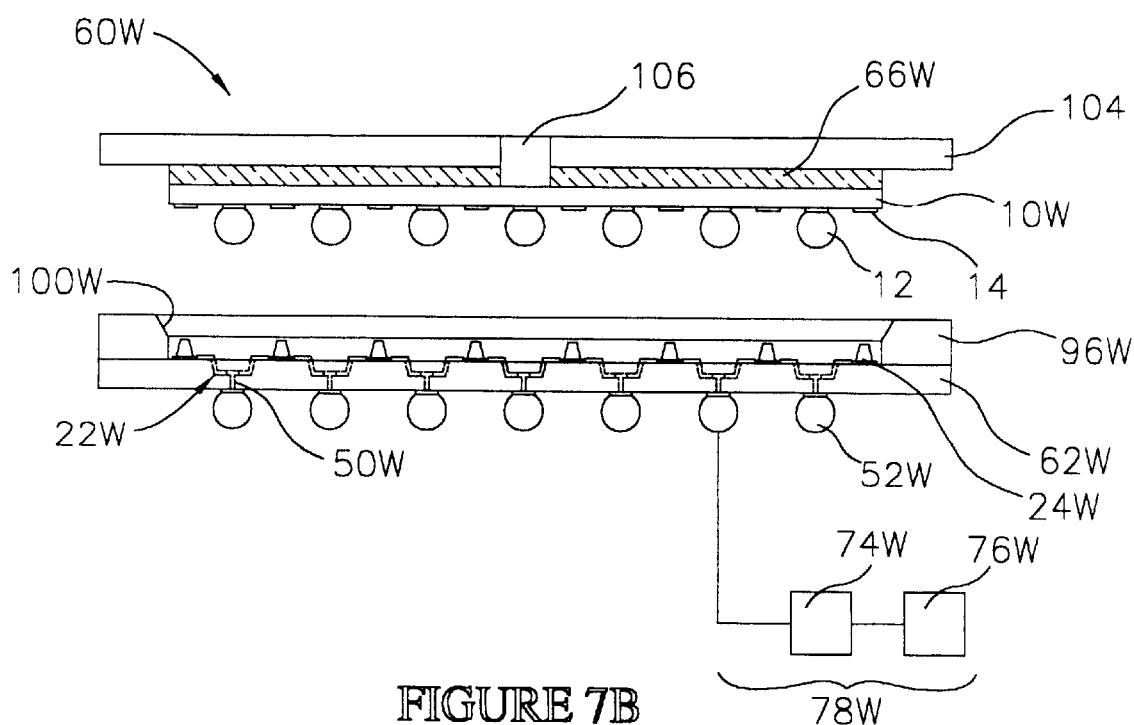
FIG. 7B is an enlarged cross sectional view of the wafer test carrier taken along section line 7B—7B of FIG. 7A.

Referring to FIGS. 7A and 7B, an alternate embodiment test carrier 60W is illustrated. The test carrier 60W is configured to temporarily package a wafer level component 10W, such as a wafer containing multiple dice, or a panel containing multiple chip scale packages for testing. The test carrier 60W comprises a base 62W, an elastomeric biasing member 66W, an alignment member 96W, and a cover 104.

The base 62W includes first contacts 22W for electrically engaging bumped contacts 12 on the component 10W, and second contacts 24W for electrically engaging planar contacts 14 on the component 10W. The first contacts 22W are formed substantially as previously described for first contacts 22A (FIG. 3A). The second contacts 24W are formed substantially as previously described for second contacts 24B (FIG. 4B).

The base 62W also includes conductive vias 50W, and terminal contacts 52W in electrical communication with the first contacts 22W. In this embodiment the conductive vias 50W are coincident to a center line of the first contacts 22W. Other conductive vias (not shown) electrically connect the second contacts 24W to the terminal contacts 52W.

The alignment member 96W includes an alignment opening 100W which functions substantially as previously described for alignment opening 98 (FIG. 6B) on alignment member 96 (FIG. 6B). The elastomeric biasing member 66W is attached to the cover 104 using an adhesive, such as silicone. In addition, the elastomeric biasing member 66W and cover 104 include a vacuum opening 106. The vacuum opening 106 can be used to apply a vacuum to the component 10W for holding the component 10W against the elastomeric biasing member 66W during assembly of the test carrier 60W. In addition, clips 108 are provided for securing the cover 104 to the base 62W.

The test carrier 60W is configured for placement on a test apparatus 74W, such as a burn-in board, in electrical communication with test circuitry 76W. The test carrier 60W, test apparatus 74W, and test circuitry 76W form a test system 78W for testing the component 10W.

Thus the invention provides an improved interconnect for testing semiconductor components having both bumped and planar contacts. Also provided are improved test carriers and test systems incorporating the interconnect. While the invention has been described with reference to certain preferred embodiments, as will be apparent to those skilled in the art, certain changes and modifications can be made without departing from the scope of the invention as defined by the following claims.

What is claimed is:

1. An interconnect for a semiconductor component having a bumped contact and a planar contact comprising:
    a substrate;
    a first contact comprising a recess on the substrate configured to electrically engage the bumped contact; and
    a second contact on the substrate configured to electrically engage the planar contact as the first contact electrically engages the bumped contact.

2. The interconnect of claim 1 wherein the first contact further comprises a conductive layer at least partially covering the recess.

3. An interconnect for a semiconductor component having a bumped contact and a planar contact comprising:
    a substrate;
    a first contact comprising a projection on the substrate configured to electrically engage the bumped contact; and
    a second contact on the substrate configured to electrically engage the planar contact as the first contact electrically engages the bumped contact.

4. An interconnect for a semiconductor component having a bumped contact and a planar contact comprising:

a substrate;

a first contact comprising a conductive polymer configured to electrically engage the bumped contact; and a second contact on the substrate configured to electrically engage the planar contact as the first contact electrically engages the bumped contact.

5. The interconnect of claim 4 wherein the second contact comprises a second conductive polymer.

6. An interconnect for a semiconductor component having a bumped contact and a planar contact comprising:

a substrate;

a first contact comprising a recess on the substrate configured to retain the bumped contact and a conductive layer on the recess configured to electrically engage the bumped contact retained in the recess; and a second contact comprising a projection on the substrate configured to electrically engage the planar contact.

7. The interconnect of claim 6 wherein the projection has a height selected to space the component from the substrate by a selected distance.

8. An interconnect for a semiconductor component having a bumped contact and a planar contact comprising:

a substrate;

a first contact comprising a recess on the substrate configured to retain and electrically engage the bumped contact; and a second contact comprising a conductive polymer projection on the substrate configured to electrically engage the planar contact on the component as the first contact electrically engages the bumped contact.

9. The interconnect of claim 8 wherein the first contact comprises a conductive polymer donut.

10. An interconnect for a semiconductor component having a bumped contact and a planar contact comprising:

a substrate;

a first contact comprising a recess on the substrate formed by a conductive polymer material and configured to retain and electrically engage the bumped contact; and a second contact comprising a projection on the substrate configured to electrically engage the planar contact as the first contact electrically engages the bumped contact.

11. The interconnect of claim 10 further comprising an alignment member on the substrate configured to align the component on the substrate.

12. The interconnect of claim 10 wherein the first contact comprises a conductive polymer donut.

13. A carrier for testing a semiconductor component having a bumped contact and a planar contact comprising:

a base configured to hold the component; and an interconnect on the base comprising a first contact comprising a recess configured to electrically engage the bumped contact and a second contact comprising a projection configured to electrically engage the planar contact as the first contact electrically engages the bumped contact.

14. The carrier of claim 13 wherein the first contact comprises a conductive layer on the recess.

15. The carrier of claim 13 wherein the first contact comprises a projection in the recess.

16. A carrier for testing a semiconductor component having a bumped contact and a planar contact comprising:

a base configured to hold the component; and an interconnect on the base comprising a first contact comprising a conductive polymer configured to electrically engage the bumped contact and a second contact comprising a conductive polymer configured to electrically engage the planar contact as the first contact electrically engages the bumped contact.

17. The carrier of claim 16 wherein the second contact comprises a projection.

18. A carrier for testing a semiconductor component having a bumped contact and a planar contact comprising:

a base configured to retain the component;

an interconnect on the base configured to electrically engage the component, the interconnect comprising:

a substrate;

a first contact comprising a recess on the substrate configured to retain and electrically engage the bumped contact;

a second contact comprising a projection on the substrate configured to electrically engage the planar contact as the first contact electrically engages the bumped contact; and a force applying mechanism on the base configured to bias the component and the interconnect together.

19. The carrier of claim 18 further comprising an alignment member on the interconnect configured to align the component on the interconnect.

20. The carrier of claim 18 wherein the first contact comprises a conductive polymer donut.

21. The carrier of claim 18 wherein the second contact comprises a conductive polymer.

22. The carrier of claim 18 wherein the projection has a height selected to space the component from the substrate by a selected distance.

* * * * *